(12) United States Patent
Hong et al.

(10) Patent No.: US 12,228,614 B2
(45) Date of Patent: Feb. 18, 2025

(54) BATTERY POWER LIMITS ESTIMATION BASED ON RC MODEL

(71) Applicant: Karma Automotive LLC, Irvine, CA (US)

(72) Inventors: Jing Hong, Trabuco Canyon, CA (US); Suvrat Ramasubramanian, Costa Mesa, CA (US); Ali Jokar, Irvine, CA (US)

(73) Assignee: Karma Automotive LLC, Irvine, CA (US)

( * ) Notice: Subject to any disclaimer, the term of this patent is extended or adjusted under 35 U.S.C. 154(b) by 362 days.

(21) Appl. No.: 17/728,095

(22) Filed: Apr. 25, 2022

(65) Prior Publication Data

US 2022/0326307 A1 Oct. 13, 2022

Related U.S. Application Data

(63) Continuation of application No. 16/775,075, filed on Jan. 28, 2020, now Pat. No. 11,313,912.

(51) Int. Cl.
*H02J 7/00* (2006.01)
*G01R 31/00* (2006.01)
(Continued)

(52) U.S. Cl.
CPC ......... *G01R 31/382* (2019.01); *G01R 31/006* (2013.01); *G01R 31/392* (2019.01);
(Continued)

(58) Field of Classification Search
None
See application file for complete search history.

(56) References Cited

U.S. PATENT DOCUMENTS 9,698,695 B1 * 7/2017 Fahlenkamp ..... H02M 3/33507
10,889,191 B1 * 1/2021 Bolger ............ B60L 58/16
(Continued)

FOREIGN PATENT DOCUMENTS

CN 102576055 B 11/2015
EP 1692754 A1 8/2006
(Continued)

OTHER PUBLICATIONS

European Patent Office, European Search Report for Application No. 21747454.3 dated Jan. 25, 2024.
(Continued)

*Primary Examiner* — Arun C Williams
(74) *Attorney, Agent, or Firm* — Honigman LLP; Grant Griffith; Thomas J. Appledorn (57) ABSTRACT

A method of estimating a maximum power limit of a battery cell at a specified prediction time using an improved RC equivalent circuit battery model and based on the battery cell's state of charge (SOC), temperature, and state of health (SOH). The method includes determining the battery cell's peak and continuous current limits, predicting a peak voltage after the specified prediction time based on the peak current limit, determining buffer values for the predicted peak voltage and the temperature of various battery components, setting a maximum current limit based on the buffer values, predicting a maximum voltage after the specified prediction time based on the maximum current limit, and determining a maximum power limit based on the predicted maximum voltage and the maximum current limit.

20 Claims, 5 Drawing Sheets

(51) Int. Cl.
*G01R 31/382* (2019.01)
*G01R 31/392* (2019.01)
*H01M 10/42* (2006.01)

(52) U.S. Cl.
CPC ........ *H01M 10/42* (2013.01); *H01M 2200/10* (2013.01); *H01M 2220/20* (2013.01)

(56) References Cited

U.S. PATENT DOCUMENTS

| | | | |
|---|---|---|---|
| 11,097,721 B1* | 8/2021 | Zhao | B60K 6/485 |
| 2009/0174369 A1 | 7/2009 | Kawahara et al. | |
| 2011/0127958 A1* | 6/2011 | Ishishita | B60W 10/06 |
| | | | 320/109 |
| 2012/0179435 A1 | 7/2012 | Song et al. | |
| 2013/0278221 A1 | 10/2013 | Maeda | |
| 2014/0302355 A1 | 10/2014 | Boehm et al. | |
| 2015/0251556 A1* | 9/2015 | Meyer | B60K 6/442 |
| | | | 701/22 |
| 2016/0039419 A1 | 2/2016 | Wampler et al. | |
| 2016/0131714 A1 | 5/2016 | Kuusisto et al. | |
| 2017/0254858 A1 | 9/2017 | Weicker et al. | |
| 2017/0259686 A1* | 9/2017 | Lee | H01M 10/441 |
| 2018/0086222 A1 | 3/2018 | Juang et al. | |

FOREIGN PATENT DOCUMENTS

| | | |
|---|---|---|
| KR | 100669476 B1 | 1/2007 |
| WO | 2019199219 A1 | 10/2019 |

OTHER PUBLICATIONS

International Search Report (Korean Intellectual Property Office), for Application PCT/US2021/015245 dated May 21, 2021.

* cited by examiner

BATTERY POWER LIMITS ESTIMATION BASED ON RC MODEL

CROSS-REFERENCE TO RELATED APPLICATION

This application is a continuation of, and claims priority under 35 U.S.C. § 120 from, U.S. patent application Ser. No. 16/775,075, filed on Jan. 28, 2020. The disclosure of this prior application is considered part of the disclosure of this application and is hereby incorporated by reference in its entirety.

BACKGROUND

The present disclosure relates to a battery power limit estimation method, wherein the method is based on an RC equivalent circuit model for a battery cell.

Li-ion batteries are used as the source of energy for many electrical systems, especially in hybrid electric vehicles (HEVs) and electric vehicles (EVs). In these vehicles, the battery interacts with other components by means of a Battery Management System (BMS) to provide power to the vehicle and meet the vehicle's energy demand while maintaining the safety of the electrical system.

The reliability of these electrical systems is highly dependent of the health and safety of the battery, and therefore on the ability of the BMS to provide operation data that allows for peak performance without jeopardizing the health and safety of the battery. Controlling and monitoring a battery installed in an HEV or EV is impossible without a fast and accurate model of the battery to be used by the BMS. Li-ion battery models have been used for estimating metrics of the battery, including state-of-charge (SOC), state-of-health (SOH), state-of-energy (SOE) and state-of-power (SOP). Also, the battery models are employed to help BMSs with the functions of battery control, real-time observation, parameter estimation, and optimization of the battery.

In all HEVs and EVs, it is necessary for the BMS to report the real-time power capability of the battery pack to other vehicle systems such as the Hybrid Control Unit (HCU). The SOP is used by the BMS to estimate the power capability based on the battery current, SOC, temperature, and SOH. An accurate measure of this power capability is helpful in providing the required power for the HEV or EV based on the driver's demand or different environmental conditions while ensuring that other systems do not overtax the battery and jeopardize its health and safety.

In order to accurately estimate the battery power capability at a present time, the cell voltage and temperature after a specified prediction time should be predicted and considered. Also, the temperatures of other battery modules and pack components should be considered to protect these components and systems from reaching a critical working temperature due to power overdraw or overcharge. Therefore, it is necessary to have a model to calculate these variables—especially under different SOC, cell temperature, and SOH conditions. However, all presently available BMSs use a simple structure that ignores these variables while determining power capability. This has caused inaccurate power calculation especially in aged batteries, batteries operating in low temperature conditions, and batteries with low SOC. Inaccurate power estimates can result in system underperformance or operation outside of safe parameters.

Conventional methods for calculating battery power capability include the Partnership for a New Generation of Vehicles (PNGV) Hybrid Pulse Power Characterization (HPPC) method. This method uses an internal resistance look-up table for different SOC and temperature values to predict the battery cell voltage after a specified prediction time. However, this method does not take into consideration the effects of the battery polarization level on power calculations. Therefore, the conventional method is not accurate in many cases, especially in cases of low SOC and temperature. To solve this problem, an interactive method of estimation based on an improved battery model is needed to calculate the battery polarization and consider it in the voltage and peak power prediction process.

SUMMARY

Disclosed herein is a method of predicting a maximum power that a battery pack is able to provide or receive at a given time by considering all battery limits, including but not limited to minimum cell voltage, minimum battery voltage, maximum cell temperature, maximum module temperature, and maximum pack components temperature. In one embodiment, the method employs a RC model for a battery cell to predict the voltage for the battery cell at a specified time in different SOC, temperature, current, voltage, and SOH conditions. In one embodiment, the method uses a buffer function to consider all the above listed battery limitations for peak power calculation. In one embodiment, the method may be used by vehicles such as (but not limited to) electric vehicles, hybrid electric vehicles, and plug-in hybrid electrical vehicles to calculate the peak current and/or the peak power of a battery pack installed in the vehicle.

Further disclosed herein is a system for estimating a maximum power limit of a battery cell at a specified prediction time, comprising a sensor and a controller. In one embodiment, the sensor system is configured to receive a plurality of temperature measurements from a plurality of temperature sensors. In one embodiment, the controller is configured to receive data for a plurality of battery cell parameters and the plurality of temperature measurements from the sensor system. In one embodiment, the controller is configured to estimate the maximum power limit of the battery cell using a method such as the method disclosed above.

In one embodiment, the method of estimating a maximum power limit of a battery cell comprises determining a plurality of battery cell parameters; determining a peak current limit and a continuous current limit based on at least one of the plurality battery cell parameters; determining a predicted peak voltage using an RC equivalent circuit model of the battery cell, wherein at least one of a plurality RC equivalent circuit model parameters is set based on a specified prediction time, at least one of the plurality of battery cell parameters, and the peak current limit; determining a voltage buffer value based on the predicted peak voltage; determining a temperature buffer value based on a plurality of temperature measurements; determining a maximum current limit based on a weight function applied to the peak current limit and the continuous current limit, wherein the weight function value is determined based on the voltage buffer value and the temperature buffer value; determining a predicted maximum voltage based on the RC equivalent circuit model of the battery, wherein at least one of the plurality of RC equivalent circuit model parameters is set based on a specified prediction time, at least one of the plurality of battery cell parameters, and the peak current limit; determining a voltage buffer value based on the predicted peak voltage; and determining the maximum power limit based on the maximum current limit and the maximum voltage limit. In one embodiment, at least one of the plurality of parameters of the RC equivalent circuit model is set based on the specified prediction time, at least one of the plurality of battery cell parameters, and the maximum current limit.

In one embodiment, the plurality of battery cell parameters includes at least one of a state of charge (SOC) of the battery cell, a temperature of the battery cell, and a state of health (SOH) of the battery cell.

In another disclosed embodiment, the maximum power limit is a maximum discharge power limit, the peak current limit is a peak discharge current limit, and the continuous current limit is a continuous discharge current limit. In another disclosed embodiment, the maximum power limit is a maximum charge power limit, the peak current limit is a peak charge current limit, and the continuous current limit is a continuous charge current limit.

In another disclosed embodiment, the battery cell is a battery cell included in a battery module comprising at least one battery cell. In another disclosed embodiment, the battery module is a battery module included in a battery pack comprising at least one battery module.

In another disclosed embodiment, the plurality of temperature measurements includes at least one measurement from the set of a maximum battery cell temperature, a maximum battery module temperature, and a maximum battery pack components temperature. In another disclosed embodiment, the plurality of temperature measurements includes a temperature of at least one device related to the battery cell by proximity or by an electric connection to the battery cell.

In another disclosed embodiment, the RC equivalent circuit model performs a state of charge (SOC) calculation to predict what the state of charge (SOC) will be after the specified prediction time has elapsed as part of determining the predicted peak voltage and the predicted maximum voltage. In another disclosed embodiment, the RC equivalent circuit model performs a state of charge (SOC) calculation to estimate the state of charge (SOC) at an earlier time as part of determining the predicted peak voltage and the predicted maximum voltage.

Other aspects, features, and techniques will be apparent to one skilled in the relevant art in view of the following detailed description of the embodiments.

BRIEF DESCRIPTION OF THE DRAWINGS

The features, objects, and advantages of the disclosed embodiments will become more apparent from the detailed description set forth below when taken in conjunction with the drawings in which like reference characters identify correspondingly throughout and wherein.

DETAILED DESCRIPTION

One aspect of the disclosure is directed to a power limit estimation method.

References throughout this document to "one embodiment," "certain embodiments," "an embodiment," or similar term mean that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. For example, two or more of the innovative methods described herein may be combined in a single method, but the application is not limited to the specific exemplary combinations of methods that are described herein.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The character "N" refers hereinafter to the last member of a set or the total count of members in a set. The character "X" refers hereinafter to a variable member of a set. The characters "A", "B", "C", etc. refer to a specific but otherwise undefined member of a set.

A detailed description of various embodiments is provided; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the disclosed embodiments.

Figure 1:
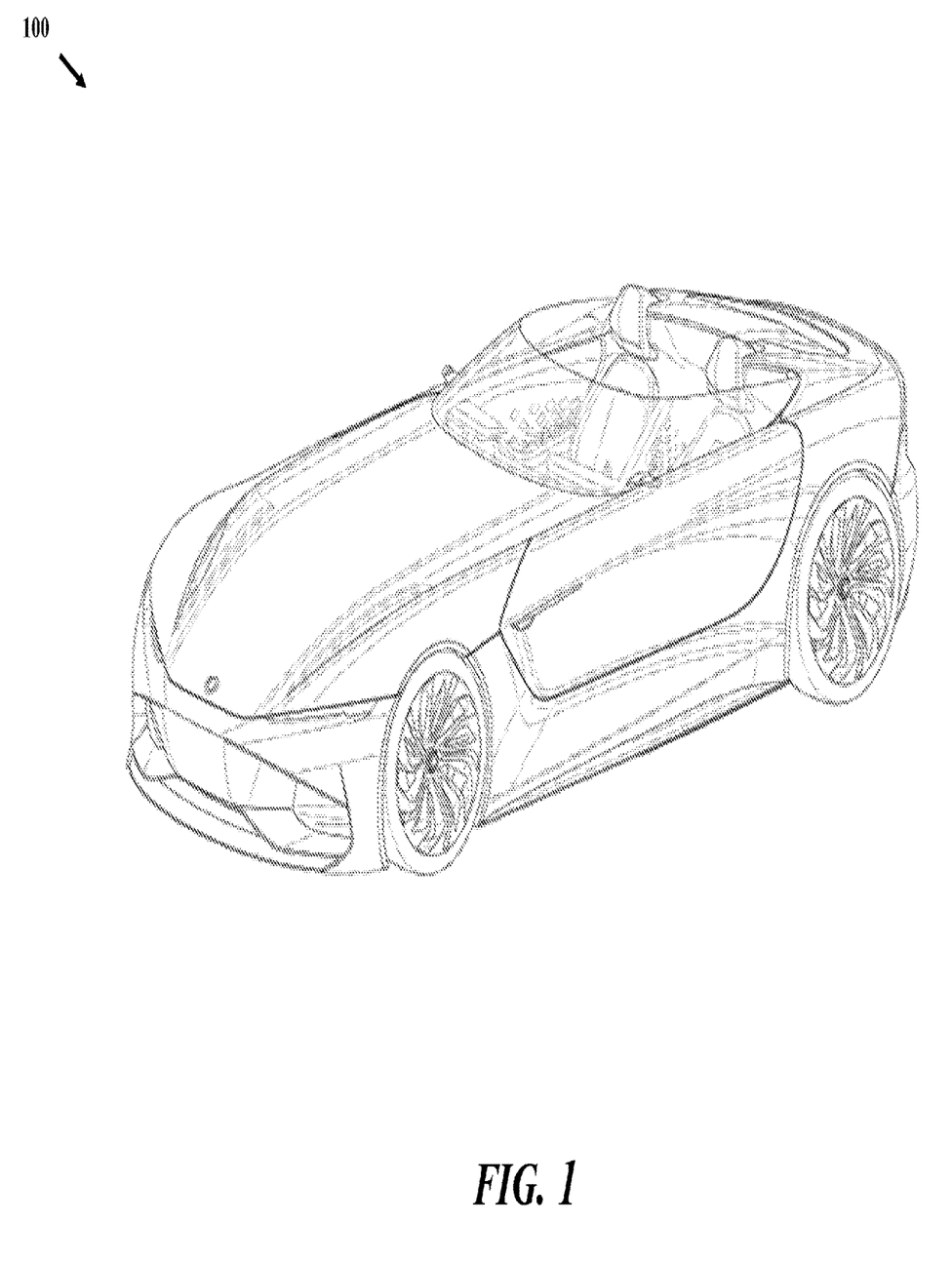
FIG. 1 is a perspective view of an exemplary embodiment of a vehicle including a battery pack with use for a power limit estimation method.

FIG. 1 is a perspective view of an exemplary embodiment of a vehicle 100 including a battery pack 210 with use for a power limit estimation method 300, wherein the power limit is a function of the continuous power the battery pack 210 can deliver at a given time and the peak power the battery pack 210 can deliver at a given time. The vehicle 100 shown in FIG. 1 is exemplary. The power limit estimation method 300 may be used with any vehicle including a battery pack or any other system with use for a battery power limit estimation method.

Figure 2:
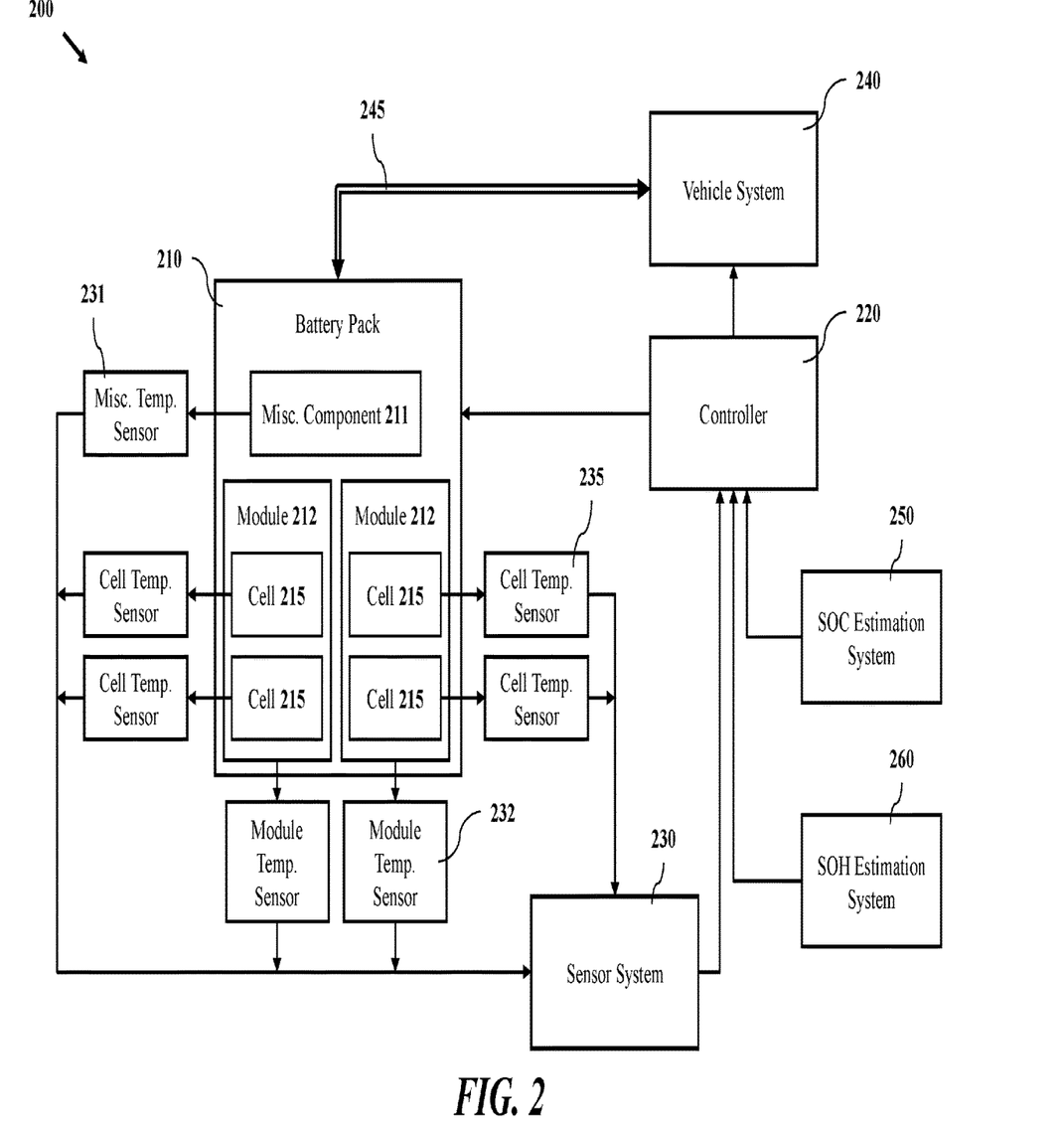
FIG. 2 is a flow diagram of an exemplary embodiment of a system for implementing a power limit estimation method.

FIG. 2 is a flow diagram of an exemplary embodiment of a system 200 for implementing a power limit estimation method 300. In one embodiment, the system 200 includes a battery pack 210, a controller 220, a sensor system 230, and a vehicle system 240, wherein the vehicle system 240 is connected to the battery pack 210 by means of a power conduit 245. In one embodiment, the system 200 receives data from other estimation systems such as a state of charge (SOC) estimation system 250 and a state of health (SOH) estimation system 260.

In one embodiment, the battery pack 210 comprises at least one battery module 212, and each of the at least one battery modules 212 may further comprise at least one battery cell 215. In one embodiment, the power limit estimation method 300 is applied on a per-cell basis—the power limit estimation method 300 provides a power limit estimate for each individual battery cell 215. In another embodiment, the power limit estimation method 300 is applied on a per-module basis. In another embodiment, the power limit estimation method 300 is applied to the battery pack 210 as a whole.

In one embodiment, the sensor system 230 comprises a plurality of sensors, including but not limited to a cell temperature sensor 235 for each battery cell 215 in the battery pack 210, a module temperature sensor 232 for each battery module 212 in the battery pack 210, and a miscellaneous temperature sensor 231 for any miscellaneous components 211 in the battery pack 210. In one embodiment, the sensor system 230 passes sensor data from the plurality of sensors to the controller 220, whereafter the controller 220 determines a battery power limit estimation based at least in part on the sensor data. In one embodiment, the controller 220 may further base the determination of a battery power limit estimation based on a plurality of parameters provided by other estimation systems such as a state of charge (SOC) estimation system 250 and a state of health (SOH) estimation system 260.

In another embodiment, the battery pack 210 discharges power to the vehicle system 240 across the power conduit 245. In one embodiment, after the controller 220 determines a power limit estimation, the controller 220 sends instructions to the battery pack 210 not to provide more power to the vehicle system 240 than is allowable under the power limit. In another embodiment, after the controller 220 determines a power limit estimation, the controller 220 sends instructions to the vehicle system 240 not to draw more power from the battery pack 210 than is allowable under the power limit.

In another embodiment, the battery pack 210 charges power using the vehicle system 240 across the power conduit 245. In this embodiment, the vehicle system 240 may be a dedicated charging system such as a solar panel grid or an alternating charging system, such as a motor in regenerative breaking mode. In one embodiment, after the controller 220 determines a power limit estimation, the controller 220 sends instructions to the battery pack 210 not to charge more power from the vehicle system 240 than is allowable under the power limit. In another embodiment, after the controller 220 determines a power limit estimation, the controller 220 sends instructions to the vehicle system 240 not to provide more power to the battery pack 210 than is allowable under the power limit.

Figure 3:
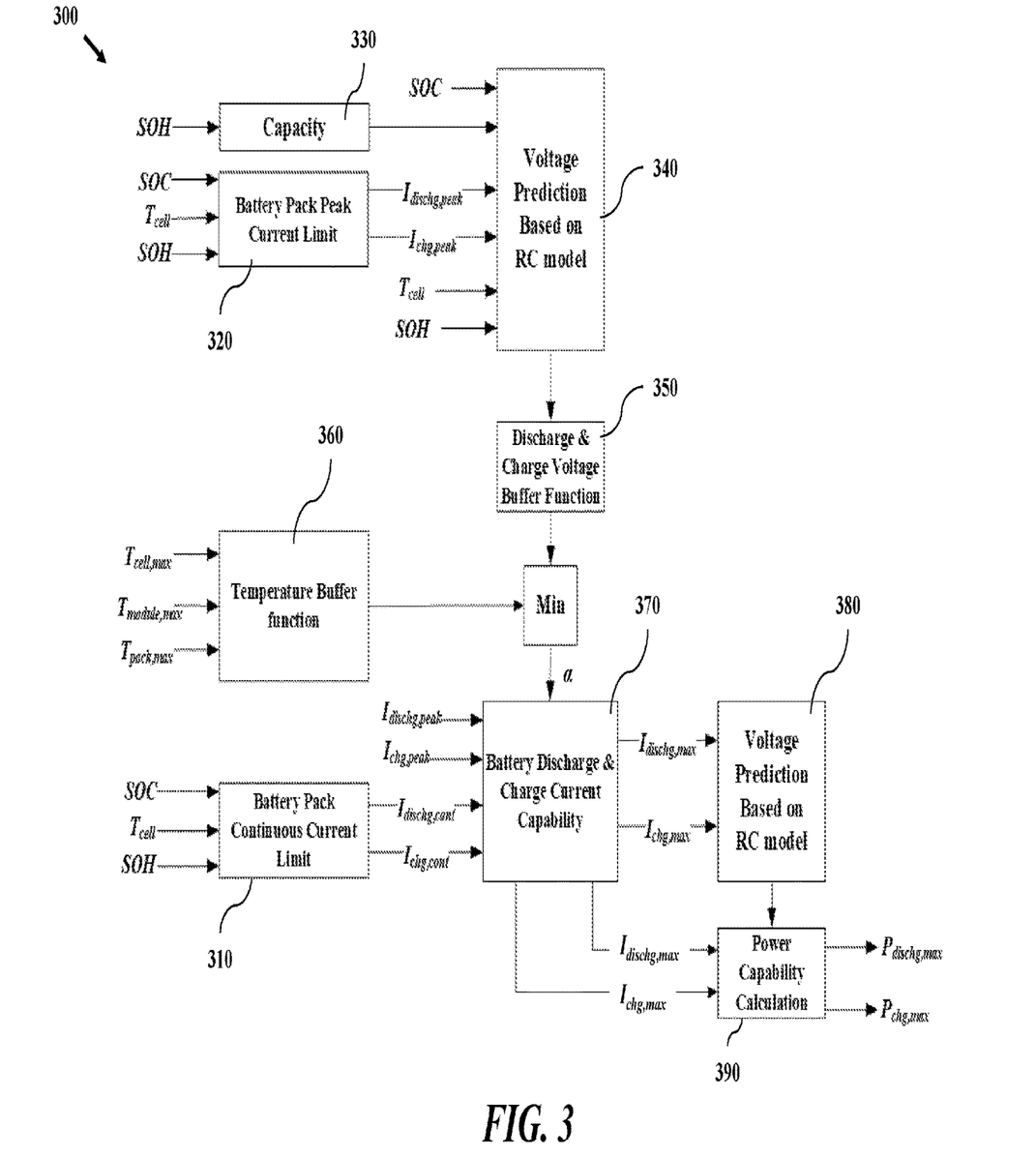
FIG. 3 is a block diagram of an exemplary embodiment of a power limit estimation method.

FIG. 3 is a block diagram of an exemplary embodiment of a power limit estimation method 300, wherein the power limit estimation method 300 is applied to a battery cell 215. In one embodiment, the power limit estimation method 300 comprises a continuous current limit block 310, a peak current limit block 320, a capacity block 330, a peak voltage prediction block 340, a discharge/charge voltage buffer function block 350, a temperature buffer function block 360, a discharge/charge current capability block 370, a max voltage prediction block 380, and a power capability calculation block 390. In one embodiment, the power limit estimation method 300 estimates a power limit based on a plurality of battery cell parameters. In one embodiment, the parameters of the plurality of battery cell parameters include the state of charge (SOC) of the battery cell 215, the temperature $T_{cell}$ of the battery cell 215, and the state of health (SOH) of the battery cell 215.

In one embodiment, the continuous current limit block 310 determines a continuous discharge current limit $I_{dischg,cont}$ and a continuous charge current limit $I_{chg,cont}$ based on the state of charge (SOC) of the battery cell 215, the temperature $T_{cell}$ of the battery cell 215, and the state of health (SOH) of the battery cell 215. In one embodiment, $I_{dischg,cont}$ and $I_{chg,cont}$ act as a safe operation limit for the battery cell 215—as long as the charge and discharge current to and from the battery cell 215 remain at a magnitude lower than $I_{dischg,cont}$ and $I_{chg,cont}$, the battery cell 215 will operate safely.

In one embodiment, the peak current limit block 320 determines a peak discharge current limit $I_{dischg,cont}$ and a peak charge current limit $I_{chg,peak}$ based on the state of charge (SOC) of the battery cell 215, the temperature $T_{cell}$ of the battery cell 215, and the state of health (SOH) of the battery cell 215. As with battery continuous current limits, all Li-ion cell manufacturers report the discharge peak current limits ($I_{dischg,cont}$) and the charge peak limits ($I_{chg,peak}$) of the battery cell 215 in different SOC and temperature conditions for 10 second pulses of discharge or charge duration. In one embodiment, the reported peak current limits are the current capability of the battery cell 215 for different SOC and temperature values, assuming that the battery cell 215 is discharged or charged from rest and open circuit voltage (i.e. the battery is not carrying a load). However, the manufacturer-reported peak current limits do not factor in alternate starting conditions, such as the possibility that a battery cell might be expected to discharge shortly after a charge cycle. Further, the reported peak current limits do not factor in design limitations at the battery module 212 or battery pack 210 level. In one embodiment, it is possible to correct these oversights by use of an improved current limit; an improved current limit estimation method may be used by the continuous current limit block 310 and/or the peak current limit block 320.

In one embodiment, the capacity block 330 determines the capacity of the battery cell 215 based on the state of health (SOH) of the battery cell 215. In one embodiment, the capacity is defined as the usable charge capacity of the battery cell 215 at 25° C. with 1C constant discharge rate and a given SOH value, with usable charge capacity measured from a full charge to a minimum charge defined by a cut-off voltage.

In one embodiment, the peak voltage prediction block 340 predicts the cell voltage based on the discharge and charge peak current limits. In one embodiment, the predicted peak cell voltage is considered in the discharge/charge voltage buffer function 350. In one embodiment, the peak voltage prediction block 340 consists of two parts: SOC Calculation and Voltage prediction.

In order to predict the cell voltage at prediction time $t_K$ seconds from the present time, it is necessary to estimate the final SOC resulting from applying $I_{dischg,peak}$ or $I_{chg,peak}$ to discharge or charge the battery over the course of $t_K$ seconds. In one embodiment, $SOC_{dischg,final}$ is defined as the SOC value for the battery cell 215 after the cell is discharged at a rate of $I_{dischg,peak}$ for a specified prediction time $t_K$ and $SOC_{chg,final}$ is defined as the SOC value for the battery cell 215 after the cell is charged at a rate of $I_{chg,peak}$ for a specified prediction time $t_K$. In one embodiment, the prediction of the final SOC is calculated as follows:

$$SOC_{dischg,final} = SOC_0 + \frac{I_{dischg.peak} \times t_K}{Capacity}$$

$$SOC_{chg,final} = SOC_0 + \frac{I_{chg.peak} \times t_K}{Capacity}$$

wherein $SOC_0$ is the SOC value for the battery cell 215 at the present time and $t_K$ is the specified prediction time for which the power limit estimation method 300 is reporting the power capability. In one embodiment, $t_K$ can vary depending on which control strategies the HCU is using. In one embodiment, if $SOC_{dischg,final}$ is less than $SOC_{min}$ (e.g. the battery cell 215 is expected to fully discharge during the prediction time $t_K$), the final SOC value will be set at the $SOC_{min}$ and $I_{dischg,peak}$ will be recalculated as follows:

$$I_{dischg.peak} = \frac{SOC_{min} - SOC_0}{(t_K / Capacity)}$$

such that discharging at the reported discharge current limit will not discharge more from the battery cell 215 than what is needed to maintain a minimum SOC. In one embodiment, if the $SOC_{chg,final}$ is higher than $SOC_{max}$ (e.g. the battery cell 215 is expected to be fully charged during the prediction time $t_K$), then the final SOC value will be set at the $SOC_{max}$ and $I_{chg,peak}$ will be recalculated as follows:

$$I_{chg.peak} = \frac{SOC_{max} - SOC_0}{(t_K / Capacity)}$$

such that charging at the reported charge current limit will not charge the battery cell 215 more than what is allowable based on a maximum SOC. In one embodiment, $SOC_{min}$ and $SOC_{max}$ are set based on design parameters for operation of the battery cell 215.

In one embodiment, this SOC definition's value for capacity is updated based on the capacity determined by the capacity block 330. In one embodiment, the SOH value is estimated by a SOH block in the BMS.

Figure 4:
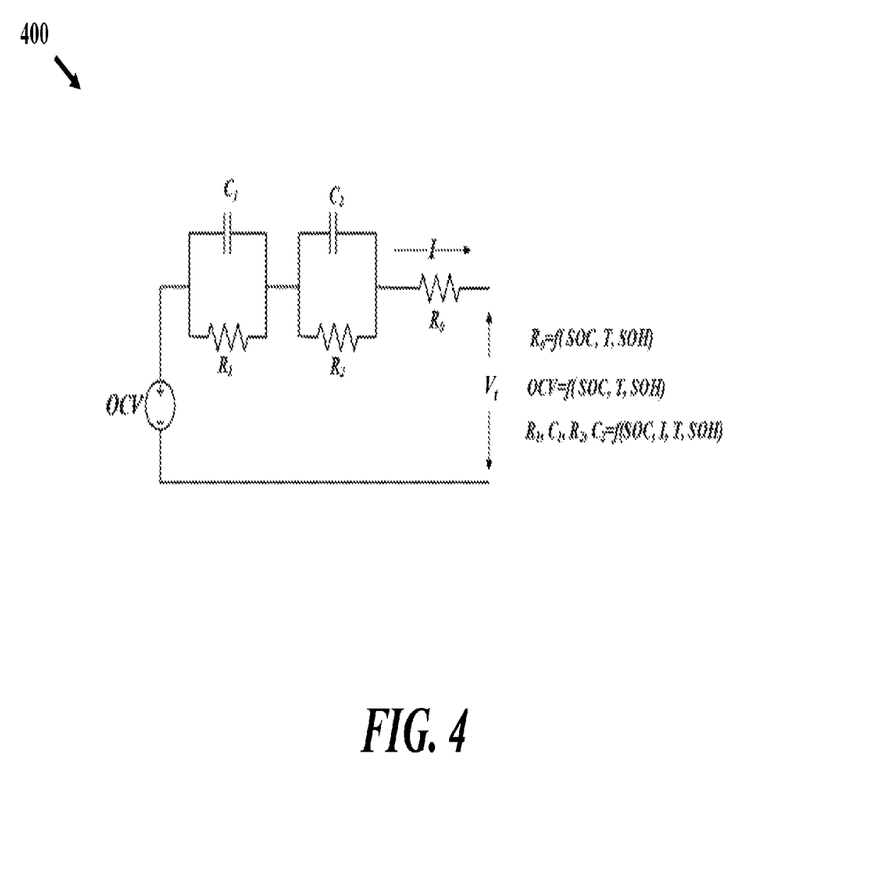
FIG. 4 is a circuit diagram of an exemplary embodiment of a two branches RC model equivalent circuit for a battery cell.

In one embodiment, to calculate the power capability, it is necessary to have a battery model to predict the cell voltage after a sampling period $\Delta t$ if the battery is discharged or charged by $I_{dischg,peak}$ or $I_{chg,peak}$, respectively. This model can be imperial or a physics-based model. In one embodiment, a two branches RC model 400 (see FIG. 4) is used to predict the cell voltage and model the battery polarization level in response to various conditions. FIG. 4 is a circuit diagram depicting an exemplary embodiment of a RC model 400 for use in the power limit estimation method 300. In one embodiment, all RC parameters (including but not limited to $R_0$, $C_1$, $R_1$, $C_2$, $R_2$, and OCV) may be estimated by using a look-up table populated with data from tests performed on the battery cell 215. In one embodiment, $R_0$ is determined as a function of the state of charge (SOC) of the battery cell 215, the battery cell 215 temperature $T_{cell}$, and the state of health (SOH) of the battery cell 215. In one embodiment, OCV is determined as a function of the state of charge (SOC) of the battery cell 215, the battery cell 215 temperature $T_{cell}$, and the state of health (SOH) of the battery cell 200. In one embodiment, $C_1$, $R_1$, $C_2$, and $R_2$ are determined as a function of the state of charge (SOC) of the battery cell 215, the equivalent circuit current I, the battery cell 215 temperature $T_{cell}$, and the state of health (SOH) of the battery cell 200. In one embodiment, the parameters of the RC model 400 are predicted by means of an unscented Kalman filter method.

In one embodiment, by using RC model 400, the cell terminal voltage ($V_t$) at time $t_k$ can be calculated as follows:

$$V_{t,k} = OCV_k + I_k \times R_{0,k} + U_{1,k-1} e^{-\Delta t/(R_1 C_1)} + I_k \times R_{1,k}(1 - e^{-\Delta t/(R_1 C_1)}) + U_{2,k-1} e^{-\Delta t/(R_2 C_2)} + I_k \times R_{2,k}(1 - e^{-\Delta t/(R_2 C_2)})$$

wherein $\Delta t$ is the incremental sampling period of the battery measurement, k is the sampling step number, and K is the number of sampling steps taken (such that $1 \leq k \leq K$ and $K\Delta t = t_K$). In one embodiment, in order to predict the cell voltage, this equation is solved by assuming constant current discharge or charge at $I_{dischg,peak}$ or $I_{chg,peak}$ for the specified prediction time $t_K$. The initial values of $U_1$ and $U_2$ are also necessary to solve the equation and should be estimated alongside the battery SOC at the SOC block. In one embodiment, the initial values of $U_1$ and $U_2$ are treated as 0. In one embodiment, if the predicted discharge voltage is less than $V_{min}$, or the predicted charge voltage is higher than $V_{max}$, then the battery peak current limits may be revised based on those minimum and maximum cell voltage limits.

Figure 5:
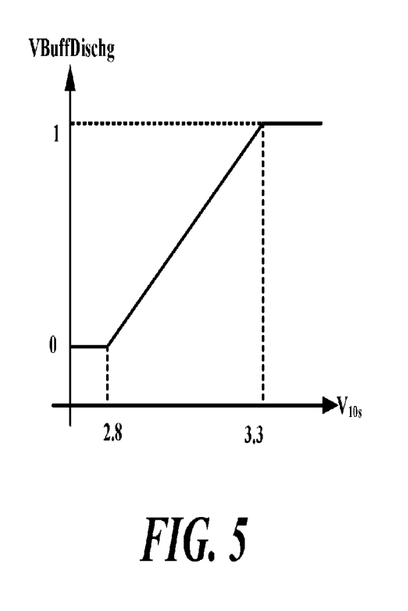
FIG. 5 is a graphic illustration of an exemplary embodiment of a relationship between a discharge voltage buffer function and a predicted voltage.
Figure 6:
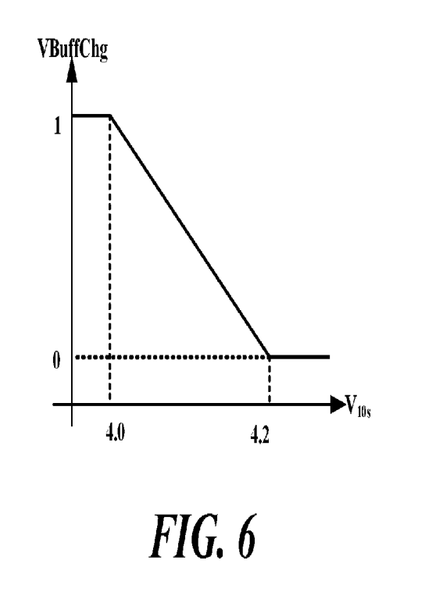
FIG. 6 is a graphic illustration of an exemplary embodiment of a relationship between a charge voltage buffer function and a predicted voltage.

In one embodiment, the discharge/charge buffer function block 350 defines a discharge voltage buffer value or a charge voltage buffer value based on the predicted cell voltage determined by the peak voltage prediction block 340, wherein the charge/discharge voltage buffer value is a weight function representing a limit on the ability of the battery cell 215 to charge or discharge current. In one embodiment, the discharge/charge buffer function block 350 determines a discharge buffer value based on a cell peak discharge voltage value predicted by the peak voltage prediction block 340. The discharge buffer function may be determined by a piecewise function such as the function represented in FIG. 5. In one embodiment, the discharge/charge buffer function block 350 determines a charge buffer value based on a cell peak charge voltage value predicted by the peak voltage prediction block 340. The charge buffer function may be determined by a piecewise function such as the function represented in FIG. 6.

Figure 7:
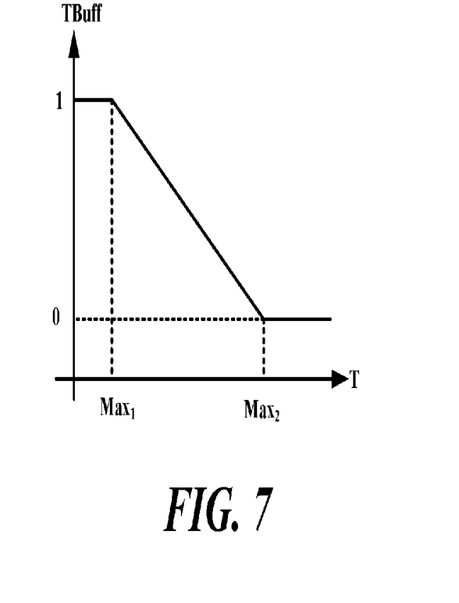
FIG. 7 is a graphic illustration of an exemplary embodiment of a relationship between a temperature buffer function and a temperature of a battery component.

In one embodiment, the temperature buffer function block 360 determines a value for a temperature buffer function wherein the temperature buffer function is a weight function representing a limit on the ability of the battery cell 215 to charge or discharge current. In one embodiment, the temperature buffer function is defined based on the temperature of each battery component, and is represented as a piecewise function such as the function represented in FIG. 7—the temperature buffer function gradually drops in value from 1 to 0 between two temperature maximum limits $T_{max,1}$ and $T_{max,2}$. Different batteries may have different temperature buffer functions; however, in the primary embodiment, it is necessary to have three temperature buffer functions as follows:

Cell Temperature buffer function: The maximum temperature of all cells in the battery pack 210 should be considered in determining the battery current capability. The first $T_{max}$ limit may be set at 40° C. and the second $T_{max}$ limit may be set at 55° C.

Module Temperature buffer function: The maximum temperature of all modules in the battery pack 210 should be considered in determining the battery current capability. The first $T_{max}$ limit may be set at 40° C. and the second $T_{max}$ limit may be set at 70° C.

Pack Components Temperature buffer function: The maximum temperature of at least one of the pack components in the battery pack 210 should be considered in determining the battery current capability. The first $T_{max}$ limit may be set at 40° C. and the second $T_{max}$ limit may be set at 100° C.

In one embodiment, the battery discharge/charge current capability block 370 determines a maximum discharge current value $I_{dischg,max}$ and a maximum charge current value $I_{chg,max}$ based on $I_{dischg,peak}$, $I_{chg,peak}$, $I_{dischg,cont}$, $I_{chg,cont}$, and the plurality of buffer values determined by the charge/discharge voltage buffer function block 350 and the temperature buffer function block 360.

In one embodiment, the battery maximum current capability can be defined as a value between the peak current limit and continuous current limit as follows:

$$I_{dischg,max} = \alpha_{dischg} \times I_{dischg,peak} + (1 - \alpha_{dischg}) \times I_{dischg,cont}$$

$$I_{chg,max} = \alpha_{chg} \times I_{chg,peak} + (1 - \alpha_{chg}) \times I_{chg,cont}$$

where $\alpha$ is the buffer function, a weight function with a value between zero and one. In one embodiment, this function represents the capability of the battery to deliver discharge or charge peak currents. In one embodiment, if the buffer value is 1, the battery is 100% capable of discharging at the peak discharge current value (or charging at the peak charge current value), and 0% capable if the buffer value is 0. In one embodiment, to quantify the buffer function, it is necessary to quantify the battery limitations preventing the battery from using 100% peak currents.

In one embodiment, $\alpha_{dischg}$ and $\alpha_{chg}$ are determined as minimum values from the set of corresponding values determined by the discharge/charge voltage buffer function block 350 and the temperature buffer function block 360, such that if any one buffer value produced by either of the two blocks 350 and 360 indicates a condition that would restrict or prevent the battery cell from delivering peak discharge power or receiving peak charge power, $\alpha_{dischg}$ and $\alpha_{chg}$ are reduced and the battery discharge/charge current capability block 370 weighs the continuous current value more heavily in determining a present maximum discharge/charge current value.

In one embodiment, the max voltage prediction block 380 predicts the cell voltage based on the discharge and charge maximum current limits determined by the battery discharge/charge current capability block 370. The max voltage prediction block 380 may use the same function and RC model 400 as the peak voltage prediction block 340, except with $I_{dischg,max}$ and $I_{chg,max}$ as the inputs instead of $I_{dischg,peak}$ and $I_{chg,peak}$.

In one embodiment, the power capability calculation block 390 determines a maximum discharge and charge power based on $I_{dischg,max}$, $I_{chg,max}$, and the cell voltage predicted at the max voltage prediction block 380. In one embodiment, the maximum discharge and charge power may be determined as follows:

$$P_{dischg,max} = I_{dischg,max} \times V_{dischg,predict}$$

$$P_{chg,max} = I_{chg,max} \times V_{chg,predict}$$

While this disclosure makes reference to exemplary embodiments, it will be understood by those skilled in the art that various changes in form and details may be made therein without departing from the scope of the claimed embodiments.

What is claimed is:

1. A non-transitory computer-implemented method when executed on a microprocessor causes the microprocessor to perform operations comprising:
    obtaining a peak current limit and a continuous current limit of a battery cell;
    determining a maximum current limit based on a weight function value applied to the peak current limit and the continuous current limit;
    determining a maximum voltage based on the maximum current limit; and
    determining a maximum power limit of the battery cell based on the maximum current limit and the maximum voltage limit.

2. The non-transitory computer-implemented method of claim 1, wherein the operations further comprise:
    obtaining a temperature measurement associated with the battery cell;
    determining a temperature buffer value based on the temperature measurement;
    determining a peak voltage based on the peak current limit;
    determining a voltage buffer value based on the peak voltage; and
    determining the weight function value based on the voltage buffer value and the temperature buffer value.

3. The non-transitory computer-implemented method of claim 2, wherein the temperature measurement comprises at least one of a maximum battery cell temperature, a maximum battery module temperature, or a maximum battery pack components temperature.

4. The non-transitory computer-implemented method of claim 1, wherein the operations further comprise:
    obtaining a state of charge of the battery cell, a temperature of the battery cell, and a state of health of the battery cell,
    wherein obtaining the peak current limit and the continuous current limit comprises determining the peak current limit and the continuous current limit based on the state of charge of the battery cell, the temperature of the battery cell, and the state of health of the battery cell.

5. The non-transitory computer-implemented method of claim 4, wherein the operations further comprise determining a capacity of the battery cell based on the state of health of the battery cell.

6. The non-transitory computer-implemented method of claim 5, wherein the capacity of the battery cell comprises a usable charge capacity of the battery cell.

7. The non-transitory computer-implemented method of claim 1, wherein the operations further comprise:
    determining an operation limit of the battery cell based on the continuous current limit, the continuous current limit comprising a continuous discharge current limit and a continuous charge current limit,
    wherein a charge current of the batter cell remains at a lower level than the continuous charge current limit and a discharge current remains at a lower level than the discharge current limit.

8. The non-transitory computer-implemented method of claim 1, wherein the battery cell resides in a battery module.

9. The non-transitory computer-implemented method of claim 7, wherein the battery module comprises the battery cell and one or more other battery cells.

10. The non-transitory computer-implemented method of claim 1, wherein the operations further comprise:
   obtaining an RC equivalent circuit model of the battery cell;
   setting parameters of the RC equivalent model based on the maximum current limit,
   wherein determining the maximum voltage of the battery is based on the RC equivalent circuit model.

11. A vehicle system comprising:
   a battery cell;
   a sensor system; and
   a controller in communication with the battery cell and the sensor system, the controller configured to perform operations comprising:
      obtaining a peak current limit and a continuous current limit of the battery cell;
      determining a maximum current limit based on a weight function value applied to the peak current limit and the continuous current limit;
      determining a maximum voltage based on the maximum current limit; and
      determining a maximum power limit of the battery cell based on the maximum current limit and the maximum voltage limit.

12. The vehicle system of claim 11, wherein the operations further comprise:
   obtaining a temperature measurement associated with the battery cell;
   determining a temperature buffer value based on the temperature measurement;
   determining a peak voltage based on the peak current limit;
   determining a voltage buffer value based on the peak voltage; and
   determining the weight function value based on the voltage buffer value and the temperature buffer value.

13. The vehicle system of claim 12, wherein the temperature measurement comprises at least one of a maximum battery cell temperature, a maximum battery module temperature, or a maximum battery pack components temperature.

14. The vehicle system of claim 11, wherein the operations further comprise:
   obtaining a state of charge of the battery cell, a temperature of the battery cell, and a state of health of the battery cell,
   wherein obtaining the peak current limit and the continuous current limit comprises determining the peak current limit and the continuous current limit based on the state of charge of the battery cell, the temperature of the batter cell, and the state of health of the battery cell.

15. The vehicle system of claim 14, wherein the operations further comprise determining a capacity of the battery cell based on the state of health of the battery cell.

16. The vehicle system of claim 14, wherein the capacity of the battery cell comprises a usable charge capacity of the battery cell.

17. The vehicle system of claim 11, wherein the operations further comprise:
   determining an operation limit of the battery cell based on the continuous current limit, the continuous current limit comprising a continuous discharge current limit and a continuous charge current limit,
   wherein a charge current of the batter cell remains at a lower level than the continuous charge current limit and a discharge current remains at a lower level than the discharge current limit.

18. The vehicle system of claim 11, wherein the battery cell resides in a battery module.

19. The vehicle system of claim 17, wherein the battery module comprises the battery cell and one or more other battery cells.

20. The vehicle system of claim 11, wherein the operations further comprise:
   obtaining an RC equivalent circuit model of the battery cell;
   setting parameters of the RC equivalent model based on the maximum current limit,
   wherein determining the maximum voltage of the battery is based on the RC equivalent circuit model.

* * * * *